US005757283A

United States Patent [19]
Janoska

[11] Patent Number: 5,757,283
[45] Date of Patent: May 26, 1998

[54] DEVICE USED FOR LONG TERM MONITORING OF MAGNETIC FIELDS

[75] Inventor: Mark A. Janoska, Lawrenceville, N.J.

[73] Assignee: Public Service Electric and Gas Company, Newark, N.J.

[21] Appl. No.: 637,498

[22] Filed: Apr. 25, 1996

[51] Int. Cl.$^6$ .................................... G08B 21/00
[52] U.S. Cl. ............... 340/870.16; 324/260; 340/657
[58] Field of Search ................ 340/870.16, 870.07, 340/870.06, 870.17, 657, 658, 664; 324/126, 127, 117 R, 266, 260

[56] References Cited

U.S. PATENT DOCUMENTS

| 4,829,298 | 5/1989 | Fernandes | 340/870.16 |
| 5,300,924 | 4/1994 | McEachern | 340/658 |
| 5,315,232 | 5/1994 | Stewart | 324/72 |
| 5,438,256 | 8/1995 | Thuries | 324/127 |
| 5,544,665 | 8/1996 | Litovitz | 128/897 |
| 5,550,476 | 8/1996 | Lau | 324/127 |
| 5,565,783 | 10/1996 | Lau | 324/127 |

Primary Examiner—Michael Horabik
Assistant Examiner—Albert K. Wong
Attorney, Agent, or Firm—W. Patrick Quast, Esq.

[57] ABSTRACT

There is disclosed a device for measuring the magnetic field strengths associated with a.c. electrical currents over a protracted period of time and, as required, in hostile environments. A preferable application calls for the determination of the field strengths associated with electrical currents flowing in the a.c. power distribution lines of utilities. The device includes a monitoring instrument positioned in relation to the power lines to be monitored, typically at the base of a pole immediately adjacent the pole of the power line or on a power line supporting pole itself. In order to provide for long term, powering of the monitoring device, d.c. power is developed utilizing the a.c. power that is present. The conversion from a.c. to d.c. is effected at a distance sufficiently far from the monitoring instrument so as not to have any consequence on the readings that are being taken. Readings during the protracted period are typically stored and then accessable at pre-determined periods. A device for checking the operability of the instrument is disclosed. A device for determining the lateral profile of magnetic field strengths for transverse distances from the location site of the monitoring instrument is also disclosed.

15 Claims, 3 Drawing Sheets

DEVICE USED FOR LONG TERM MONITORING OF MAGNETIC FIELDS

FIELD OF THE INVENTION

This invention relates generally to a device for monitoring the strength of magnetic fields and one particularly suitable for long term monitoring of such fields. The device disclosed implements the methodology and protocol for measuring over a protracted period of time, the magnetic field strengths of A.C. currents containing fundamental and harmonic frequencies, all as described in a U.S. patent application Ser. No. 08/637,497, filed simultaneously herewith and assigned to the same assignee, and entitled Method for Long Term Monitoring of Magnetic Fields.

BACKGROUND OF THE INVENTION

Power lines generally can be classified into transmission lines and distribution lines. For transmission lines, line current flows are relatively well defined. As a result, attending magnetic fields are essentially predictable.

Distribution lines are a different story. These lines emanate, typically, at a power company's substation. They provide the electric power to the community with its varying needs, depending on the mix of commercial and retail accounts; the day of the week; time of the day; season; etc. Phase current imbalances, neutral return currents, underground or overhead conductors, in various configurations etc., all contribute to the lack of consistency in the strength of fields these type of lines produce.

Nowadays, with alleged concerns about possible health consequences resulting from magnetic fields, it becomes important for power utility companies to ascertain the strength of fields in the vicinity of distribution lines on both a spot measurement basis, and perhaps, more importantly, over extended periods.

Various short term or spot measurement techniques near distribution lines have been utilized. Some are reported. E.g. see Paul Herouix's paper entitled "60 HZ Electric and Magnetic Fields Generated by a Distribution Network" appearing in Bioelectromagnetics, in 1987, at Vol. 8, pp 135–148.

Such spot measurements are of relatively short duration and usually are performed under circumstances where environmental conditions are favorable and easily predictable. Equipment that is used is typically battery powered since the deleterious effects of time on the performance of batteries is irrelevant. Operators are usually present for each reading. Magnetic field and corresponding measurement locations are recorded on data sheets suitable for the purpose.

Attempts at determining magnetic field strengths over the long term have focused on making spot measurements of the magnetic field along a line transverse to the path of a distribution line. This is done for a significant number of measured current levels in the different power lines. Evaluations of this data have confirmed that there is good correlation between the calculated and measured magnetic fields. By developing a load current history throughout the year and over a period of years, the resulting magnetic fields over the same period of time can be estimated. (See T. Vinh et al's paper, "Magnetic Fields Near Overhead Distribution Lines-Measurements and Estimating Technique" appearing in the IEEE Transactions on Power Delivery, Vol. 6, No. 2, April 1991). However, these are estimated results and thus subject, in fact, to perhaps significant deviations from actual values. A concerned public may not easily be persuaded of their accuracy.

Similar concerns as to the long term effects of magnetic fields attributable to a.c. electric power, and associated harmonics, can exist in the work place. Machinery utilizing high a.c. currents may have significantly higher magnetic fields. Certain types of machinery, e.g. an electric arc furnace, can be a "rich" generative source of electromagnetic fields attributable to the a.c. currents utilized-with both fundamental and harmonic content present. In view of OSHA concerns for worker safety, field strength data over a protracted period is informative and thus important.

It is therefore a primary object of this invention to provide a measuring device for implementing a methodology which ensures an accurate depiction of the actual magnetic field strengths attributable to a.c. electric current over an extended period of time.

It is a further object of this invention to provide a measuring device which functions accurately in the presence of various environmental conditions.

It is still an object of this invention to include as part of the measuring device, means for powering the device which relies on the a.c. power it is measuring to sustain its operability over the test interval.

Yet another object of this invention is to include a capability in the measuring device which provides for the storage of data so that direct human access to the monitoring equipment is minimized and can be eliminated except to make repairs on the equipment.

It is still a further object of this invention to provide a measuring device for measuring magnetic fields associated with a.c. currents of fundamental frequency and attending harmonics, as well as transients.

SUMMARY OF THE INVENTION

Towards the accomplishment of these and still other objects which will become more apparent from a reading of the following description and attending drawings, there is described a device for measuring the magnetic field strengths of a.c. electrical currents, including fundamental and/or harmonic components. Applications include the measuring of fields associated with a.c. utility power distribution lines. The invention seeks to provide a measuring device used to determine the magnetic field strengths at a particular location over a protracted period of time. The invention disclosed calls for the placement of a field monitoring device at the intended location. The device is adapted to measure the magnetic field strengths of both fundamental and/or harmonic frequencies, as desired, at various times over the protracted period.

Where environmental concerns exist, the device includes an enclosure which is adapted to protect the components of the measuring device from the weather elements of the associated environment. In this circumstance, the enclosure is fabricated from materials which will not affect the strength of the magnetic fields as would otherwise be detected by a measuring instrument if not placed in the enclosure.

Since the device is designed to ascertain long term, magnetic field strengths, the invention disclosed includes means for the powering of the monitoring device from a source of d.c. electrical power which, typically, is uninterruptable. In the circumstance where the effects of current in a.c. power lines are being monitored, means for converting the a.c. electrical power into the d.c. electrical power necessary to power the monitoring device are derived, via a.c. to d.c. conversion means, from the a.c. power that is being monitored. In order to avoid "contamination" by said conversion means, the latter is placed at a distance, sufficiently far from the monitoring instrument, so as not to affect the magnetic field strength readings being taken.

The methodology implemented calls for storage of intermittent readings throughout a protracted period. Preferably, the monitoring instrument portion of the device, itself, is of a type which includes a computer memory for such storage. Alternately, readings for the instrument can be communicated to a remote computer where the data is stored in a similar fashion. The storage of data, however accomplished, provides for subsequent analysis at an appropriately convenient time.

The measuring device includes means for adapting a particular test site so that the elements of the environment at the location do not adversely offset the performance of the monitoring device. For example, means for heating the interior of the enclosure are disclosed wherein the monitoring instrument is maintained, so as to "burn-off" entrapped moisture or to elevate the temperature of the air space immediately enveloping the instrument, thereby obviating any negative consequences attributable to environmental conditions.

The measuring device disclosed although preferably, as explained in this application, is used for determining long term, magnetic field strengths associated with a.c. power lines, has additional utilization in any circumstance, including work place situations, where the long term effects of magnetic fields associated with a.c. currents and associated harmonics are of interest or concern.

BRIEF DESCRIPTIONS OF THE DRAWINGS

DESCRIPTION OF THE PREFERRED EMBODIMENT

Figure 1:
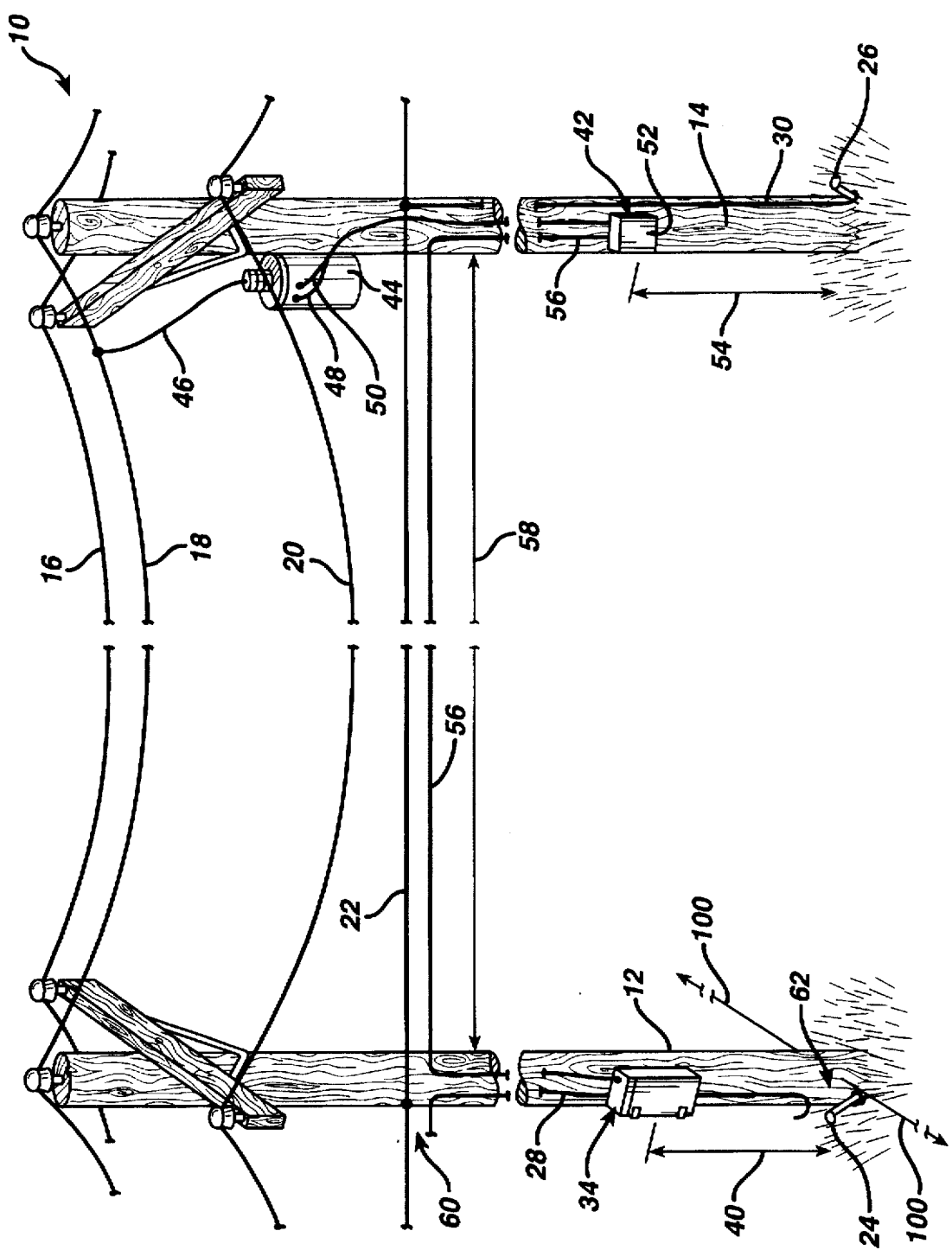
FIG. 1 is a perspective view of a landscape including a.c. power distribution lines on poles and the relative location of portions of the measuring device of the present invention.

Referring now to FIG. 1, there is shown a typical segment 10 of an a.c. power distribution system comprising utility poles 12 and 14. For example, power lines 16, 18, and 20 would carry respective phases of a three (3) phase power distribution feeder line. A system includes a common neutral 22 strung between each pole. The common neutral is tied to ground rods 24 and 26 at each of the poles via lines 28 and 30. Depending on the power needs of the community served by the distribution lines, the electric currents flowing in lines 16, 18, 20, and in the common neutral 22, are essentially inclusive of a fundamental component, typically sixty (60) Hz, plus various harmonic components. This invention describes a measuring device used to implement a method and protocol for measuring over a protracted period of time the magnetic field strengths of the a.c. currents containing these fundamental and harmonic frequencies.

For purposes of implementing the methodology of the simultaneously filed invention referred to above, for outdoor applications, a magnetic field monitoring instrument 32 (FIG. 2) is positioned in enclosure 34 which is positioned on utility pole 12. A suitable monitoring instrument is the Field Star 1000, a multiple-function, hand-held recorder for logging magnetic fields. It includes three (3) orthogonal sensing coils which measure the magnitude of the magnetic field components along the x, y, and z axis. The instrument includes a data logger which can record magnetic field data as a function of time or distance.

The Field Star includes a self contained microcomputer. Software included in the instrument displays menu options on the alpha-numeric display, 36. Options are then selected using the key pad 38. Through the display, the self-contained microcomputer provides information to the operator as to what program has been selected, what data label has been entered etc. This allows the Field Star, monitoring instrument to be operated almost entirely independently of a personal computer, except for data analyses, graphics and hard copies of the data.

In the display mode, the Field Star provides a real time, read-out of the three orthogonal vector components of the magnetic field and the resultant field magnitude. The instrument can time sample magnetic fields at sampling intervals of one second or any integer number of minutes from one to fifteen.

The enclosure 34 is positioned at a particular location 40, on the utility pole, which is approximately one meter above ground level. The enclosure 34 is positioned so that the meter 32 is in fact at one meter above ground level. The x-, y-, and z- coils of the meter 32 are respectively vertical, perpendicular and parallel to the power lines to be monitored, 16, 18, and 20.

The Field Star meter is manufactured by the Dexsil Corporation of Hamden, Conn. Field Star is a trademark of the Dexsil Corp. As purchased, the Field Star instrument is battery operated. Of necessity, the methodology of the present invention, since it is directed to recording field strengths over a protracted period of time, and preferably while the instrument is unattended, requires that a source of d.c. electrical power be provided which will power the instrument, without interruption, over that period of time.

For those purposes, the present invention provides for a sustainable d.c. electrical power source 42. In order that the d.c. electrical power source be sustainable, it is derived from the a.c. power lines being monitored. For example, the primary of a distribution transformer 44, taps off power line 18 via connecting line 46. The secondary of the distribution transformer 44 is supplied to the box 52 for converting to d.c. power via lines 48 and 50. The box 52 is positioned on utility pole 14 at a distance 54 which is approximately six feet above ground level. The d.c. voltage developed at source 42 is supplied via electrical line 56 to the enclosure 34 positioned on utility pole 12. The d.c. power source 42 is positioned on pole 14 which typically is located a sufficient distance from pole 12 so that the conversion of a.c. to d.c. power does not give rise to unwanted a.c. current sources, and associated fields, in proximity to the monitoring instrument 32. In a typical installation, the distance 58 would be on the order of one hundred and thirty feet.

The box 52 as noted earlier, is approximately six feet above ground level. This would facilitate servicing of the box as required. The d.c. voltage on line 56 represents the output voltage of a bridge rectifier circuit. For a hundred and twenty volt a.c. input on lines 48, 50, the raw d.c. voltage on line 56 would be approximately one hundred sixty-seven volts d.c. The d.c. voltage when it arrives at enclosure 34 is internally distributed through fuses.

In order to further avoid unwanted a.c. currents in the vicinity of enclosure 34, ground wire 28 is disconnected from the common neutral 22, at points 60 and 62. This does not significantly impair the function of grounding the common neutral line 22 since the remaining poles in the distribution system, of course, retain their grounding wires such as line 30 on pole 14.

Figure 2:
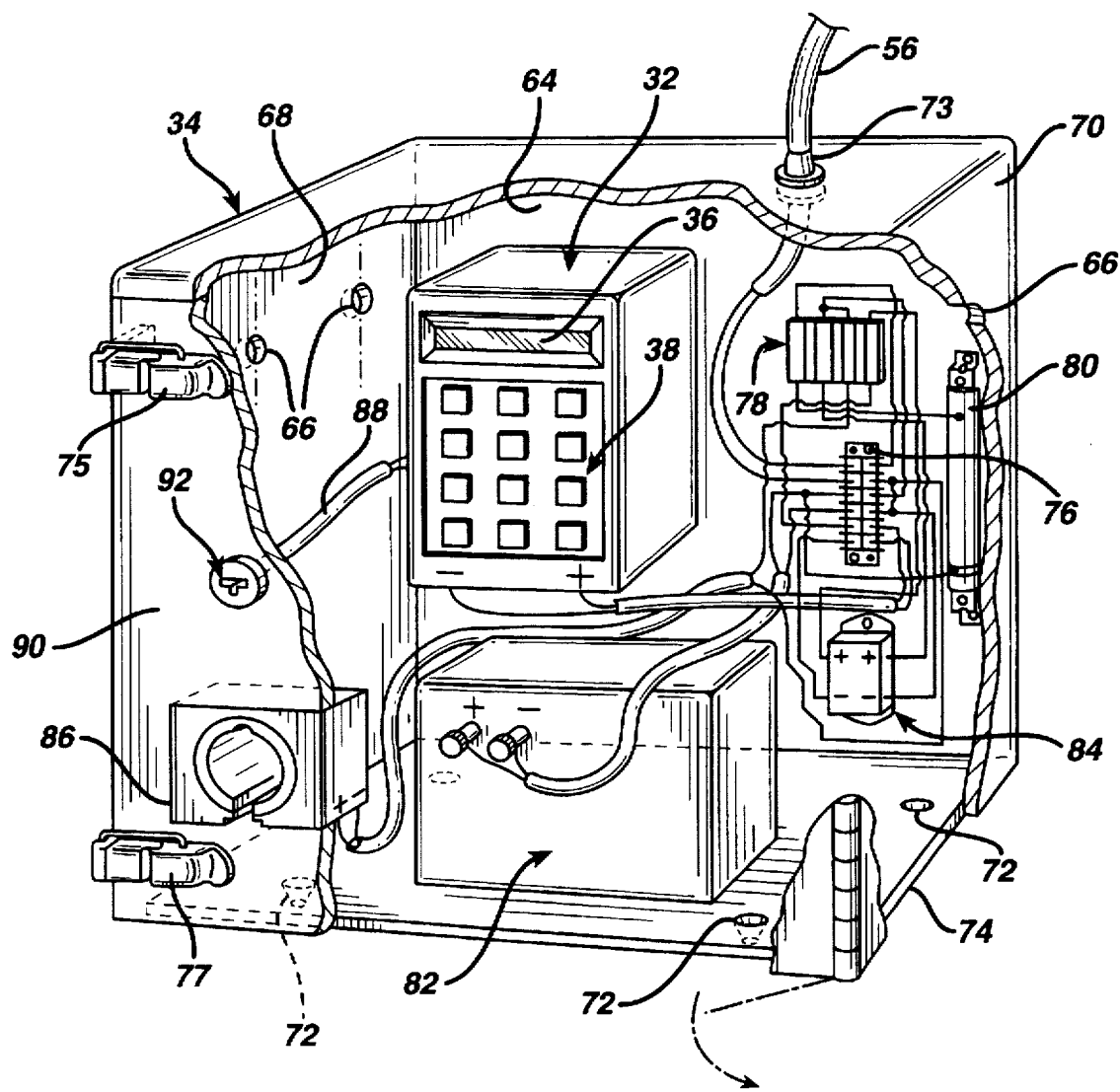
FIG. 2 is a perspective view of a part of the measuring device of the invention, broken away in section, to reveal certain of the components used to accomplish the methodology disclosed.

Referring to FIG. 2, the enclosure 34 in a partial, sectional perspective view, reveals the interior of the enclosure 34. The enclosure itself is fabricated from weather proof material, such as fiberglass. Importantly, the material selected not only for the enclosure but for the other components used should have minimal, if any, effect on the strength of the magnetic fields to be monitored by the instrument 32. Again, fiberglass is suitable in this respect. Cable fittings connecting various electrical lines to the enclosure will typically be liquid tight. Seals and gaskets, as necessary, are utilized.

An enclosure that has been found suitable for the application of the present invention is manufactured by the Hoffman Engineering Company of Anoka, Minn. The enclosure includes lockable, quick release latches, 75 and 77, which permit easy access to the interior. This style enclosure is suitable not only for locations outdoors, but in corrosive or high security environments, indoors or outdoors, over a broad range of possible applications.

The instrument 32 is positioned on the back wall 64 of the enclosure. The position on the back wall is such that when the enclosure 34 is mounted on the pole 12, the instrument, as noted above, would be at a distance 40 of one meter above ground level. Also, as noted above, the meter's position is such that the x-, y- and z coils of the instrument are respectively vertical, perpendicular and parallel to the power lines when the enclosure 34 is mounted on the pole 12. Holes 66, ³⁄₃₂" in diameter, are located in the side walls 68 and 70 of the enclosure. They are drilled at a downward 45 degree angle, as seen from the interior of the enclosure. These permit moisture release from the interior and inhibit infiltration of rain water and insects. Holes 72 in the base portion 74 drain off accumulated water, due to condensation or minimal seepage, if any.

The d.c. power provided by source 42 arrives at the enclosure on line 56, which enters the enclosure through a liquid-tight, non-metallic strain relief connector, 73.

The power on line 56 is first directed to a barrier terminal block 76 from which it is distributed through a one amp fuse, in amp block 78, to power resistor 80. The other side of resistor 80 is connected to a twelve volt battery, 82. The heat generated by the power resistor warms the enclosure during the winter and minimizes internal condensation, thus keeping the environment within the enclosure 34 suitable for year-round performance of the instrument 32. A suitable resistor is a nine hundred ohm ceramic power resistor.

The twelve volt d.c. clamp at the battery is distributed through a one amp fuse in fuse block 78 to a voltage regulator 84. It is also distributed through a ten amp fuse to an outlet 86 to be utilized during gross functinality checks as required and as described below.

The battery found fitting for this application is a twelve volt, four amp-hour, sealed lead acid maintenance free battery suitable for electronic back-up type applications. Type number, NP 4-12, manufactured by YUASA/EXIDE, INC., has been found suitable. The battery provides a relatively fixed supply voltage for the voltage regulator 84 and, of course, necessary power when the equipment at the location is being serviced and it is required to disconnect from the line 56; or during intermittent a.c. power interruptions.

The voltage regulator 84 reduces the twelve volt d.c. input to nine volts d.c. which is supplied through a one amp fuse to the metering device, 32. The voltage regulator buffers the meter from transients and provides an uninterruptable power supply as noted above.

Cable 88 connects the data output terminal (not shown) on instrument 32 to the face panel 90 of enclosure 34. The cable 88 terminates in a suitable connector 92, e.g. a standard RT 11 phone jack which will permit access to the data output terminal of the meter for on-site, down loading at periodic intervals. Alternately, or in parallel, the data on the output terminal of the meter can be remotely accessed, periodically, over telephone lines; or via a suitable radio transmission device (not shown) which can also be included in the enclosure. This would reduce the need for on-site visits to equipment calibration and repair, as required.

Figure 3:
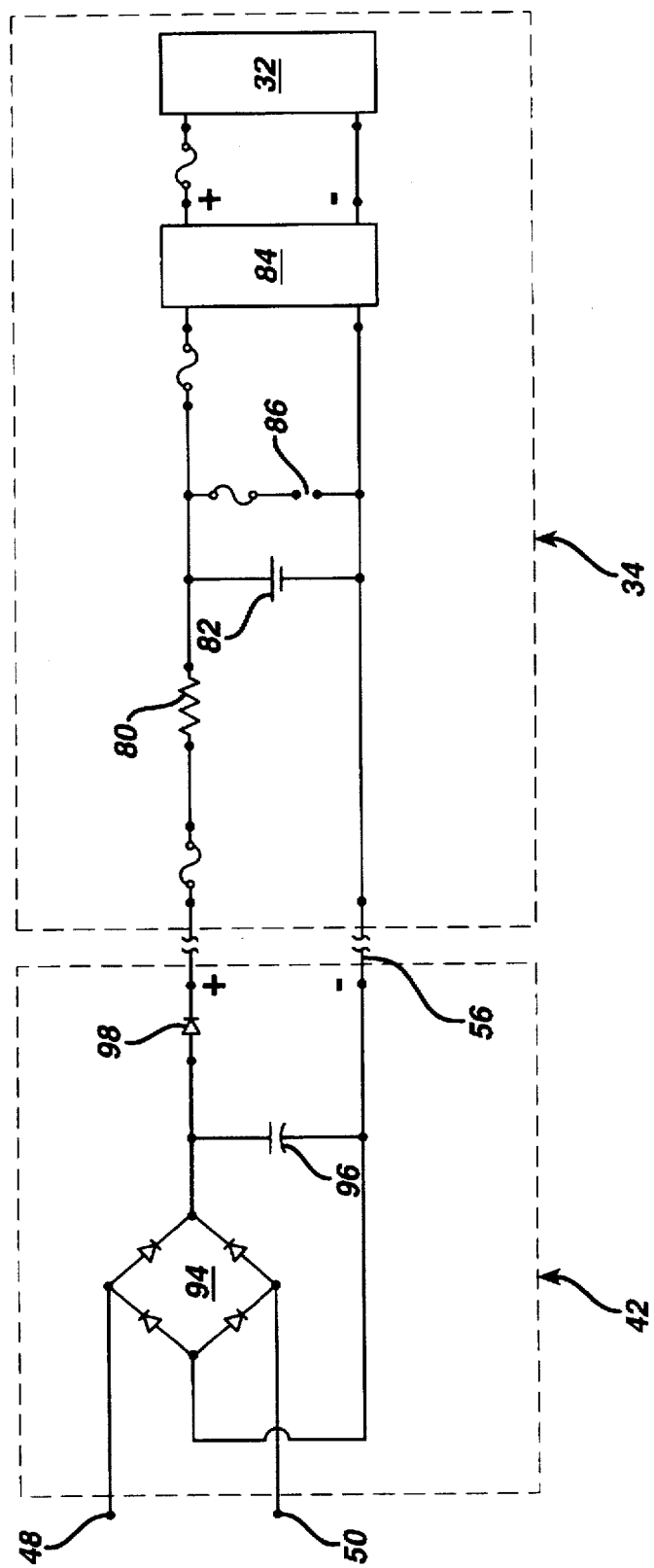
FIG. 3 is an electrical schematic of circuitry forming a part of the measuring device of the invention.

Enclosure 42 on utility pole 14 provides a source of d.c. electrical power as noted above. FIG. 3 schematically depicts the typical contents of enclosure 42. One hundred and twenty volts a.c. is received on lines 48 and 50. These are supplied to opposite ends of a typical diode bridge circuit 94. A suitable silicon bridge rectifier circuit is manufactured by the Fagor Company of Andover, Mass. Their type number FB 5002, handling an average rectified forward current of fifty amps, has been found suitable. Filter capacitor 96 is placed across the d.c. voltage output of the rectifier bridge circuit 94. Filter capacitor 96 would have a typical value of four hundred seventy microfarads and sufficient d.c. voltage rating to handle a rectified, one hundred twenty volt a.c. line voltage. Part number, 80D-471P200KT5, made by the Sprague Company of Sanford, Me., is a suitable type for this application. Diode 98 connects the high side of the filter capacitor to the output where one hundred sixty-seven volts d.c. appears.

As noted above, a built in outlet 86 is provided which brings twelve volts d.c. to the face panel 90. This typically could be a cigarette lighter outlet and is used principally to power up a magnetic field generator useful in checking the functioning of instrument 32.

Periodically, it is important to check the operability of equipment at the site, particularly the monitoring instrument 32. This typically might occur after down loading of data and before storing data for the next monitoring period. A typical magnetic field generator found useful in this regard is model 147 manufactured by the Electric Field Measurements Company, of West Stockbridge, Mass. The generator obtains the necessary a.c. power to generate the calibrating fields from a d.c. to a.c. converter, not shown, which is connected to the twelve volt d.c. outlet 86 on the enclosure face plate 90. The field generator is designed to check for gross errors in the functioning of the instrument 32. The generator loop of the field generator is aligned, successively, with each of the coils of the monitoring instrument 32. To the extent, again, gross correlation exists, the equipment is assumed to be satisfactorily operating. Further, the readings of a first meter 32 can be compared against those indicated by a spare meter so as to confirm the continued stability of the first monitoring instrument, 32. Once the stability of the monitoring instrument 32 is confirmed the intervals between calibrations can be extended.

The method of the invention set out in the simultaneously filed application identified above calls for accessing the information stored in the instrument 32 periodically. Although the data can be down loaded to a PC by an operator at the particular site, using jack 92, again, as noted earlier, the remote accessing of data can be accomplished via a telephone line hook up to the meter. Thus the enclosure permits implementation of the method of the present invention at a remote facility. Of course equipment reliability checks would be made periodically by on site visits but these can be minimized as time progresses.

The method of the invention set out in the simultaneously filed application further calls for the development of lateral profiles of the magnetic fields at varying distances along path 100, transverse to the direction of the power lines 16, 18, and 20. These profiles illustrate the magnetic field drop off rates with distance along path 100 from the enclosure 34. Another Field Star meter such as the meter 32 in enclosure 34 can be used. The Field Star meter includes a provision which allows readings to be made at various distance intervals. For purposes of the lateral profile, the method of the simultaneously filed invention calls for taking a field map reading every foot, for 200 feet in either direction, along path 100, at a height above ground equal to that of the instrument 32, namely one meter. In order to compare the measured profiles with calculated results, currents in the overhead lines 16, 18, and 20, and the common neutral 22, are detected by a suitable clamp-on ammeter. The lateral profiles are taken at periodic time intervals so as to allow for a study of the profiles for different seasonal loads. A typical interval has been every three months.

The above described hardware was used at six monitoring sites. Five of these monitored various overhead line configurations for 13, 26, and 69 kV power lines which typify standard utility overhead distribution schemes. The sixth site was near an electric distribution substation with a variety of a.c. voltage bus structures, circuit breakers, transformers, feeder rows with automatic switch gear and a control house.

A discussion of the protocal and sampling of the data collected set out in the simultaneously filed application and to the extent required for an understanding of the present application, is incorporated herein by reference.

Variations in the hardware used to implement the methodology disclosed, of course, are possible and the description of the preferred device is not to be construed as limiting. Rather the scope of the present invention is only to be limited by the breadth of the claims which follow.

What is claimed is:

1. A measuring device for measuring the magnetic field strengths of a.c. electrical currents of fundamental and/or harmonic frequencies at a particular location during a protracted period of time, while unattended, comprising:
   (a) a magnetic field monitoring instrument, adapted to measure the magnetic field strengths of the fundamental and/or harmonic frequencies desired at known times during said protracted period, in said particular location;
   (b) enclosure means adapted to said particular location such that the elements of the environment at said particular location do not adversely affect the monitoring performance of said monitoring instrument, positioned in said enclosure, over said protracted period of time;
   wherein said enclosure means is fabricated from materials which will minimally, if at all, affect the strength of the magnetic fields as would be detected by said monitoring instrument if not placed in said enclosure;
   (c) d.c. electrical power means for powering said monitoring instrument, said d.c. electrical power means sustainable without interruption, if required, over said protracted period of time so that the desired magnetic field strength readings can be produced and recorded;
   wherein the d.c. electrical power means includes a source of a.c. electrical power and means for converting said a.c. electrical power into said d.c. electrical power, said means for converting placed at a distance sufficiently far from said monitoring instrument so as not to affect the magnetic field strength readings being taken;
   wherein said enclosure means further includes heater means, powered from said source of d.c. electrical power, for heating the interior of said enclosure means; and,
   (d) means for accessing the desired magnetic field strength readings periodically for subsequent analysis.

2. The device claimed in claim 1 wherein said means for accessing further include means for storing the desired magnetic field strength readings over at least a portion of the protracted period of time.

3. The device claimed in claim 1 wherein said enclosure means is further adapted to protect said instrument from the weather elements of the environment.

4. The device claimed in claim 1 further including means for checking the operability of said device periodically.

5. The device claimed in claim 1 further comprising means for, checking, at least once, the electromagnetic effect of said enclosure means on the magnetic field readings of said instrument.

6. The device claimed in claim 1 wherein said monitoring instrument includes means for accomplishing the storing of the desired magnetic field strength readings.

7. The device claimed in claim 1 further comprising means for determining the lateral profile of the magnetic field strengths whereby the magnetic field drop off rates with distance from said particular location are determined.

8. The device claimed in claim 1 wherein the means for accessing the magnetic field strength readings is located remote to said particular location.

9. A device for measuring the magnetic field strengths of a.c. electrical currents of fundamental and/or harmonic frequencies of a.c. power lines, at a particular location in relation to said a.c. power lines, and during a protracted period of time, without the presence of an operator for a substantial part of said period of time, comprising the steps of:
   (a) a magnetic field monitoring instrument, said instrument adapted to measure the magnetic field strengths of the fundamental and/or harmonic frequencies desired at known times during said protracted period,
   (b) an enclosure, said instrument positioned in said enclosure, said enclosure adapted to protect said instrument from the weather elements of the environment, said enclosure fabricated from materials which will minimally, if at all, affect the strength of the magnetic fields as would be detected by said instrument if not placed in said enclosure;
   (c) means powering said monitoring instrument from a source of d.c. electrical power, so that the desired magnetic field strength readings can be produced and recorded, including a source of a.c. electrical power and means for converting said a.c. electrical power into said d.c. electrical power, said means for converting placed at a distance sufficiently far from said monitoring instrument so as not to affect the magnetic field strength readings being taken, said enclosure including heater means, powered from said source of d.c. electrical power, for heating the interior of said enclosure;
   (d) means for checking the operability of said device, as required, during the protracted period of time;
   (e) said instrument including means for storing the desired magnetic field strength readings; and, (f) accessing the desired magnetic field strength readings periodically for subsequent analysis.

10. The device claimed in claim 9 wherein the means for accessing include means for storing the desired magnetic field strength readings over at least a portion of the protracted period of time.

11. The device claimed in claim 9 further including means for checking the operability of said device.

12. The device claimed in claim 9 further comprising means for checking, at least once, the electromagnetic effect of said enclosure on the magnetic field readings of said instrument.

13. The device claimed in claim 9 wherein the said instrument includes means for storing the desired magnetic field strength readings.

14. The device claimed in claim 9 further comprising means for determining the lateral profile of the magnetic field strengths, whereby the magnetic field drop off rates with distance from said particular location are determined.

15. The device claimed in claim 9 wherein the means for accessing the magnetic field strength readings is located remote to said particular location.

* * * * *